United States Patent

Thomas

[15] 3,652,272

[45] Mar. 28, 1972

[54] PHENOXY PHOTOPOLYMER HAVING NO EPOXY GROUPS, AND ARTICLE MADE THEREFROM

[72] Inventor: Daniel C. Thomas, Wheaton, Ill.

[73] Assignee: Lithoplate, Inc., Covina, Calif.

[22] Filed: Oct. 31, 1969

[21] Appl. No.: 873,085

[52] U.S. Cl. ........................................96/33, 96/35.1, 96/75, 96/91, 96/86, 96/93, 96/115 R, 204/159.14

[51] Int. Cl. ........................G03f 7/02, G03c 1/68, G03c 1/52

[58] Field of Search ......................96/91 R, 115 R, 93, 33, 75, 96/35.1, 86; 204/159.14, 159.24

[56] References Cited

UNITED STATES PATENTS

| | | | |
|---|---|---|---|
| 2,690,968 | 10/1954 | Powers | 96/91 X |
| 3,019,106 | 1/1962 | Adams | 96/33 X |
| 3,278,305 | 10/1966 | Laridon et al. | 96/35.1 |
| 3,295,974 | 1/1967 | Erdmann | 96/115 X |
| 3,387,976 | 6/1968 | Sorkin | 96/33 X |
| 3,427,161 | 2/1969 | Laridon et al. | 96/115 X |
| 3,455,688 | 7/1969 | Adams et al. | 96/33 |
| 3,136,637 | 6/1964 | Larson | 96/33 X |

*Primary Examiner*—John T. Goolkasian
*Assistant Examiner*—Joseph C. Gil
*Attorney*—Owen, Wickersham & Erickson

[57] ABSTRACT

A photopolymer adapted for use in lithography, photomechanical processes, or other applications, consisting essentially of an actinic light-tanned product of a phenoxy resin of high molecular weight formed in the presence of a sensitizer which is a diazo resin or a chromium compound, such as ammonium bichromate. A photopolymer-yielding system or combination consisting essentially of a phenoxy resin and a sensitizer, which is a diazo resin or chromium compound yielding hexavalent chromium, the resin and sensitizer being in contact with each other. A lithographic plate including such photopolymer or such photopolymer-yielding system or combination. A method of making such photopolymer, comprising subjecting such photopolymer system or combination to treatment with actinic light.

16 Claims, No Drawings

PHENOXY PHOTOPOLYMER HAVING NO EPOXY GROUPS, AND ARTICLE MADE THEREFROM

This invention relates to a new phenoxy photopolymer, a new photopolymer-yielding system or combination, a lithographic plate incorporating same, and a method of making the photopolymer.

CROSS-REFERENCE

A photopolymerizable product, its production and method of use as a coating over a diazo resin to provide a high-speed lithographic plate or a photoresist is described and claimed in my copending patent application, Ser. No. 829,149, filed on May 29, 1969.

BACKGROUND OF THE INVENTION

The invention will be described with particular reference to use in the lithographic art, but, as will also be disclosed below, it has other utilities.

In the lithographic art it is well known to coat a properly prepared or pre-treated base or support material, such as a resin-coated paper stock or a protectively coated metal plate, with a sensitizer or photosensitive layer, e.g., a diazo resin or a dichromate. Then the photosensitive surface can be used as such, or it can be protectively coated, for instance with a lacquer or a resin layer, to increase its resistance to abrasion, handling, and smudging or other stresses. When the photosensitized plate is exposed to a suitable light source through a transparency or a means for selective transmission of such light, image and nonimage areas are formed, and thereafter the plate is developed to provide oleophilic ink-receiving areas and hydrophilic, ink-repellent areas, so that it can be used in a lithographic press.

As an alternative to the use of a photosensitive layer such as of a diazo resin or bichromate, other lithographic plates have employed a photopolymer coating on a base support. However, photopolymers have had the drawback of very slow light-exposure speeds with consequent prolonged exposure time; and such coatings have been sensitive to rubbing during development, so that special solvent development techniques have been required.

The present invention provides a photopolymer and photopolymerizable combination, or system, exhibiting excellent resistance to moisture and chemicals, and drying to a very tough, hard coating resistant to abrasion and to smudging or solvents. At the same time the light-exposure speed can be 10 or more times as fast as that of emulsion-developed diazo resin plates or the known solvent-developed photopolymer plates; and can be 50 to 100 times as fast as emulsion-developed photopolymer plates.

SUMMARY OF THE INVENTION

This invention provides a photopolymer of faster than normal exposure speed and suitable for use as the printing surface on a lithographic plate and for use in photomechanical and other processes. Basic to the invention is a new photopolymer-yielding system which consists essentially of (a) a phenoxy resin having a molecular weight of at least 20,000, containing about 6 percent hydroxyl groups and being a copolymerized or condensation product of bisphenol-A and epichlorohydrin substantially free of epoxy groups, and (b) a photosensitizing agent of the group consisting of the diazo resins and soluble hexavalent chromium compounds, the phenoxy resin and the photosensitizing agent being in effective contact with each other to form the photopolymer under treatment of such system with actinic light. So far as the chromium compounds are concerned, they should be soluble in whatever solvent is to be used; for example ammonium dichromate and the alkali metal dichromates are water soluble, as well as soluble in organic solvents for the resin. The photopolymer-yielding system is activatable by exposure to actinic light to form the photopolymer. The invention also relates to a lithographic plate including such photopolymer or photopolymer-yielding system and to a method for making such a plate.

In the photopolymer-yeilding system of the invention the phenoxy resin and the photosensitizer may be in effective contact with each other by virtue of a layer of resin being overcoated with a layer of sensitizer, or by virtue of a layer of sensitizer being overcoated with a layer of resin. Alternatively, if desired, the phenoxy resin (or chromium compound) and the sensitizer can be mixed together, conveniently by dissolution of both in a suitable common solvent and, for instance, applied as a coating to a suitably prepared base support to form a lithographic printing surface, or the powdered sensitizer can be sprinkled on a tacky first resin layer. The coating layers in my new system in a lithographic plate may be of the usual thickness common to ordinary good practice in this art. For example, the layer thickness can be from about 0.001 mil to about 0.5 mil.

The photospeeds of the polymer prepared by overcoating the sensitizer layer with phenoxy resin are substantially higher than the photospeed of the polymer coated from a mixed coating solution or the photospeed of the polymer prepared by overcoating the phenoxy resin with sensitizer.

In the case where the phenoxy resin is coated as the first layer and the sensitizer as the second layer the subbase may be omitted. In this case it is not necessary but it is desirable to emulsion develop with a developing lacquer.

In all cases the preparation of the phenoxy photopolymer is simplified. These phenoxy resins do not require an expensive synthesis such as cinnamoylization; the phenoxy resin is simply dissolved in a suitable solvent and the sensitizer added.

The phenoxy resins useful in this invention are polyhydroxy ethers containing 6 percent secondary hydroxyl groups and having a high molecular weight of at least 20,000 or between 20,000 and 200,000, preferably about 30,000. These resins are made by the copolymerization of bisphenol-A and epichlorohydrin and have the following unit

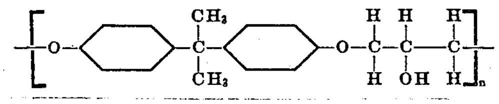

Where $n$ is about 70 to 700. For Shell's Eponol 55, $n = 700$ and the molecular weight is about 200,000. For Bakelite's Phenoxy PKHH, $n = 100$ and the molecular weight is about 30,000.

The phenoxy resins are thermoplastic, contain no or substantially no epoxy groups, have good electrical resistance, are thermally stable and have very long storage life. One such resin which has been found very useful in this invention is sold under the trademark Bakelite and designation PKHH (Union Carbide Corporation) and has a specific gravity of 1.18, molecular weight about 30,000, Brookfield Viscosity (40 percent solids in methyl ethyl ketone) of 5,500 to 7,700, softening temperature of 212° F., and when applied to a surface as a coating solution dries to a tough, flexible and generally chemically resistant film or layer. Another such resin found useful herein is available in commerce under the trademark "Eponol" 55 (Shell Chemical Company) having a molecular weight of about 200,000, and a hydroxyl equivalent of 0.35 per 100 gms. The resins are soluble in a number of organic solvents such as n-methyl-2-pyrrolidone, butyl carbitol, butyl cellosolve, diacetone alcohol, dimethyl formamide, methyl ethyl ketone (MEK) and others; and recommended mixed solvents therefor include combinations of butanol-toluene-MEK, toluene-acetone, MEK-toluene-acetone, cellosolve-acetate-MEK-toluene and others. The term "solvent" is intended to include suitable mixtures of solvents. The coatings exhibit good resistance to aqueous caustic soda, to most mineral acids and to 100 percent relative humidity at 100° F., as well as very good abrasion resistance, as determined by the Tabor Abrasion Resistance method.

The diazo compound which is effective as a photosensitizer for the phenoxy resin described herein is a diazo resin. An especially effective resin is a condensation product of para diazo diphenyl amine sulfate and formaldehyde, (See U.S. Pat. No. 2,100,063) available in commerce under the trade name Diazo Resin No. 4 (Fairmount Chemical Company) and under the trade name Diazo Litho ZA (Industrial Chemical and Dye Co.). When the photosensitizer is employed in combination with, i.e., in effective contact with, a phenoxy resin, and such combination then exposed to an actinic or ultraviolet light, the photopolymer is formed, or in other words, "tanning" occurs. In such a system the light-treated material becomes increasingly insoluble or non-swelling in the usual solvents as exposure continues up to complete loss of solubility.

With the phenoxy resins of this invention, such tanning can alternatively be effective with chromium compounds, providing hexavalent chromium, such as the chromates and dichromates of the alkali metals or of ammonium, one very effective and satisfactory chromium compound for this purpose being ammonium dichromate.

In the method of making the products and articles of the present invention, one mode calls for preparing the photopolymer-yielding system by forming a solution in an organic solvent of the phenoxy resin and a solution of the photosensitizer in a solvent, which can be organic for either the diazo resin or for the dichromate. In producing a negative-working lithographic plate, a base support of any desired material, e.g., aluminum, zinc, resin-coated paper stock or others, is first coated with a barrier layer or sub-base of a hydrophilic substance in a manner well known in this art. In one mode of the invention, a solution of the photosensitizing agent applied over the sub-base and dried to form a coating thereon; then the solution of phenoxy resin is applied over the photosensitizer coating and dried to form a second coating, after which the coated plate may by exposed through a negative transparency to a suitable source of actinic light, e.g., a xenon arc, for sufficient time to effect the desired reaction or tanning to form the photopolymer, usually for from 10 seconds to 1 minute, and is thereafter developed to remove the unreacted or nonimage areas. The resulting image surface is hard, tough, resistant to abrasion and chemical attack, and is oleophilic, to take printing ink well.

In another mode of the invention, the photopolymer layer is applied first over the support member, and the sensitizer layer follows on top of it. This mode has the disadvantage of leaving a softer, more easily damaged layer on top; however, no sub-base treatment is necessary.

In yet another mode of the invention, the phenoxy resin and the sensitizer are dissolved in a solvent or solvent mixture common to both, i.e., one in which both can be dissolved, and the lithographic plate prepared as described above is coated with such solution. There are used in this combination solution from about 2 percent to 20 percent by weight of the phenoxy resin component and from about 0.1 percent to 5 percent by weight of the photosensitizing agent. In any of these methods, coating can be effected in any desired manner, e.g., by whirling, spraying, wiping on, or other. The coating is dried, exposed as described above to form the photopolymer, and then developed to form a negative-working plate.

In order to produce a positive-working plate, an article made as described above is coated, prior to exposure, with a hydrophilic organic colloid or substance such as polysaccharide gum, especially gum arabic, or a synthetic substance adapted to swell or form a colloid in water such as polyvinylpyrrolidone, and is then exposed to actinic light as described. The exposed phenoxy resin-sensitizer-hydrophilic colloid-light-reaction product forms the hydrophilic background areas of a lithographic plate; and the hydrophilic colloid is removed by development from the unexposed areas of sensitizer-phenoxy resin, the latter areas forming the oleophilic image areas of the lithographic plate.

An advantage of the product, article and method of this invention is that the photopolymer produced has an exposure speed much faster than that of the photosensitive layer per se. In particular, the photopolymer obtained by light-treating the system or combination wherein a coating of phenoxy resin lies over the coating of the diazo resin, has an exposure speed 10 times faster than that of a layer of the diazo resin alone. In addition, where the photopolymer is the top layer or, where the top layer is made from an admixture of the phenoxy resin and the sensitizer, the working surface is especially hard, tough and resistant to abrasion, so much so as to enable use of mechanical development techniques without damage to such surface, to obviate the need for interleafing in storage, and to enable long periods of use. It is a further advantage that the reaction polymer and method can be also used in photoresist applications such as printed circuits, inasmuch as the photopolymer exhibits good electrical resistance; in chemical milling, because the product of this invention exhibits good resistance to chemicals used therein; in making name plates, photoengraving and many other applications. It is a particular advantage that the product and method of this invention are useful in making either negative-working or positive-working printing surfaces such as for lithographic plates. The printing surfaces of such plates exhibit high resistance to smudging and to attack by solvents, and the number of runs which can be made by such plates is high.

DETAILED DESCRIPTION OF THE INVENTION

The following specific examples illustrate the invention and some modes of carrying it out, but variations and modifications, of course, can be made therein without departing from the spirit and scope of the invention.

EXAMPLE 1

A diazo-phenoxy photopolymer may be made as follows: To 15 grams of a solution of phenoxy resin in methyl ethyl ketone, designated as Bakelite PKHS and containing 40 percent by weight phenoxy resin Bakelite PKHH (Union Carbide Corporation) of a molecular weight of 30,000, there are added as a solvent 85 grams of n-methyl-2-pyrrolidone, and then 5 grams of Diazo Resin No. 4 (Fairmount Chemical Company), i.e., of the condensation product of para diazo diphenyl amine and formaldehyde, and the whole is stirred until almost all of the diazo resin is dissolved. The solution is then decanted off from a slight amount (about 1 gram) of undissolved diazo resin.

A brush grained aluminum plate, which has been coated with phytic acid as a sub-base or barrier layer, is then coated with the above solution by wiping it on, any excess being wiped off, and the so-treated plate is air-dried for 1 hour. The dried coating thickness was about 0.5 mil. The dried plate was then exposed for 8 minutes to a xenon arc lamp through a negative transparency and the plate was then emulsion-developed, using the emulsion described as Example 1 in U.S. Pat. No. 3,455,688. The unexposed areas of the plate were developed clean to provide good hydrophilic background areas of the lithographic printing plate, and the ultraviolet light-exposed areas of the plate formed the oleophilic diazo-phenoxy photopolymer ultraviolet light-reaction product image areas of the lithographic printing plate. The plate of this example provides good clear image areas, clean background areas, and ran for 1,000 impressions on a lithographic printing press without failure.

The phenoxy-diazo photopolymer made as described can also be used in photoresist applications such as printing circuits or chemical milling, or in name plates, photoengraving, etc.

It has been found, however, that better exposure speeds are obtained when the plate bearing a barrier layer or sub-base, is coated first with the diazo resin or bichromate sensitizer, dried and then coated with the phenoxy resin. A negative-working presensitized plate having a layer of diazo resin sensitizer and no overcoating of phenoxy of resin requires an exposure time of 2 minutes to a 1,000–1,200 foot candle xenon arc; whereas such a plate treated to provide a coating over the diazo resin sensitizer of a phenoxy resin as described herein has an exposure speed under the same light which is 10 times faster than that of the presensitized plate per se.

EXAMPLE 2

A plate is coated with the phenoxy resin and diazo resin as described in Example 1 and after the coating is properly dried, there is applied an overcoat of polyvinyl-pyrrolidone (PVP) as a 5 percent by weight solution in n-propyl alcohol, and the plate thoroughly dried in air. The plate is then exposed through a positive transparency for 5 minutes to a carbon arc and is then developed by rubbing up with 14° Be' gum arabic and developing ink. The exposed areas are found to be completely hydrophilic and the unexposed areas are oleophilic and ink-receptive to form the image.

EXAMPLE 3

A negative-working lithographic printing plate is made as follows: 10 grams of Bakelite PKHS resin solution as described in Example 1 are mixed with 90 grams of n-methyl-2-pyrrolidone and there are then added 5 grams ammonium bichromate and the whole stirred until all is dissolved. A brush grained aluminum plate, previously coated with a sub-base as in Example 1, is now coated with the above resin-bichromate solution by wiping on the plate is then air-dried overnight. It is then exposed for 2 minutes to a xenon arc lamp through a negative transparency; and is thereafter emulsion developed as Example 1, whereupon the unexposed areas are developed clean to provide the hydrophilic background areas of the lithographic plate and the ultraviolet light-exposed areas of the plate and the ultraviolet light-exposed areas of the plate form the oleophilic bichromated phenoxy photopolymer ultraviolet light-reaction product of the plate. The plate of this example ran for 1,000 impressions on a lithographic printing press without failure.

The photopolymer made of the components show this Example can also be used in photoresist applications such as printed circuits, chemical milling, photoengraving, etc.

EXAMPLE 4

A name plate is made by coating a red-anodized aluminum plate with a solution mixture containing 10 parts by weight of Bakelite PKHS resin and 5 parts by weight ammonium bichromate dissolved in 90 parts by weight of n-methyl-pyrrolidone, the plate wiped down to a very thin coating and then air-dried for several hours. The coated plate is then exposured through a suitable transparency to 100 lux units, to a carbon arc; and is then developed by soaking in a tray of n-methyl-pyrrolidone for 1 minute, then washing with a water spray, after which the plate is etched in 15 percent aqueous solution of NaOH until the image appears from loss of unprotected anodized coating.

EXAMPLE 5

An unsensitized, sub-base, ball grained aluminum plate is dip-coated with 5 percent dry weight ammonium bichromate solution in distilled water, air-dried and then overcoated in one area with Bakelite PKHH resin in a 0.4 percent by weight solution in 1:1 cyclohexanone-xylene and is air-dried. The plate was then exposed for 10 minutes to a xenon arc lamp through a negative transparency and was emulsion developed, as in Example 1, to develop a bichromated phenoxy polymer having a fairly clear background. In an area of this plate having no resin coating applied, no image was developed. The step wedge, solid, of the phenoxy resin-bichromate photopolymer was 4, and visible, 8.

EXAMPLE 6

A positive-working lithographic plate is made as follows: A plate made as described in Example 3, but prior to exposure to the xenon arc lamp, a portion of it is coated with hydrophilic gum arabic by wiping on a 14° Be' aqueous gum arabic and the coated plate is then air-dried 30 minutes and thereafter exposed to a carbon arc for 4 minutes, through a suitable transparency. It is then emulsion developed as in Example 1. No image appears on the portion not coated with the gum arabic, and a fair image appears on the gum arabic-treated portion.

Having now described the invention, what is claimed is:

1. A photopolymer adapted for use in making lithographic printing surfaces consisting of a photolytic product of (a) a phenoxy resin having no epoxy groups and having a molecular weight of at least 20,000, containing 6 percent hydroxyl groups and being a condensation product of bisphenol-A and epichlorohydrin, and (b) a photosensitizing agent selected from the group consisting of diazo resins, salts of chromic acid and chromium compounds each capable of yielding hexavalent chromium, the photolytic product having been subjected to actinic light.

2. A photopolymer-yielding system adapted for use in making a lithographic printing surface, consisting of (a) a phenoxy resin having no epoxy groups and having a molecular weight of at least 20,000, containing 6 percent hydroxyl groups and being a condensation product of bisphenol-A and epichlorohydrin, and (b) a photosensitizing agent selected from the group consisting of diazo resins, salts of chromic acid and chromium compounds each capable of yielding hexavalent chromium, the phenoxy resin and photosensitizing agent being in contact with each other in the system.

3. A system as in claim 2 wherein the phenoxy resin has a molecular weight of about 30,000.

4. A system as in claim 2 wherein the photosensitizing agent is a condensate of formaldehyde and para diazo diphenylamine sulfate.

5. A system as in claim 2 wherein the photosensitizing agent is ammonium dichromate.

6. A negative-working lithographic plate comprising a base support, a barrier layer on the support, and a photopolymer-yielding system coating the barrier layer and consisting essentially of (1) a phenoxy resin having no epoxy groups and having a molecular weight of at least 20,000, containing 6 percent hydroxyl groups and being a condensation product of bisphenol-A and epichlorohydrin, and (2) a photosensitizing agent selected from the group consisting of diazo resins, salts of chromic acid and chromium compounds each capable of yielding hexavalent chromium, the phenoxy resin and the photosensitizing agent being in contact with each other in the system.

7. The plate of claim 6 wherein the system consists of a layer of the photosensitizing agent coating the barrier layer and a layer of the phenoxy resin coating the photosensitizing layer.

8. The plate of claim 6 wherein the system consists of a layer of the phenoxy resin coating the barrier layer and a layer of the photosensitizing agent coating the phenoxy resin layer.

9. A plate as in claim 6 wherein the system consists of a layer of an admixture of the phenoxy resin and the photosensitizing agent.

10. A plate as in claim 6 wherein the photosensitizing agent is ammonium dichromate.

11. A plate as in claim 6 wherein the photosensitizing agent is a diazo resin.

12. A plate as in claim 11 wherein the diazo resin is a condensation product of formaldehyde and para diazo diphenylamine sulfate.

13. A positive-working lithographic plate comprising a base support, a barrier layer on the support, and a photopolymer-yielding system coating the barrier layer and consisting essentially of (1) a phenoxy-resin having no epoxy groups, having a molecular weight of at least 20,000 and having 6 percent hydroxyl groups and being a condensation product of bisphenol-A and epichlorohydrin, and (2) a photosensitizing agent selected from the group consisting of diazo resins, salts of chromic acid and chromium compounds each capable of yielding hexavalent chromium, and a coating over the photopolymer-yielding system consisting essentially of a hydrophilic organic colloid substance.

14. A plate as in claim 13 wherein the hydrophilic organic substance is gum arabic.

15. A plate as in claim 13 wherein the hydrophilic organic substance is polyvinyl-pyrrolidone.

16. A lithographic plate comprising a base support, a coating thereover consisting of a phenoxy resin having no epoxy groups and a molecular weight of at least 20,000, with 6 percent hydroxyl groups and being a condensation product of bisphenol-A epichlorohydrin, and a coating over the phenoxy resin of a photosensitizing agent selected from the group consisting of diazo resins, salts of chromic acid and chromium compounds each capable of yielding hexavalent chromium, the phenoxy resin and photosensitizing agent adapted to form a photopolymer under the action of actinic light.

* * * * *